United States Patent
Takeda

(10) Patent No.: US 9,935,624 B2
(45) Date of Patent: Apr. 3, 2018

(54) PWM SIGNAL GENERATING APPARATUS, MOTOR CONTROL APPARATUS, AND LIGHT SCANNING APPARATUS

(71) Applicant: CANON KABUSHIKI KAISHA, Tokyo (JP)

(72) Inventor: Shoji Takeda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/217,276

(22) Filed: Jul. 22, 2016

(65) Prior Publication Data

US 2017/0040989 A1  Feb. 9, 2017

(30) Foreign Application Priority Data

Aug. 7, 2015 (JP) ................. 2015-157178

(51) Int. Cl.
| | |
|---|---|
| *H03K 7/08* | (2006.01) |
| *G03G 15/043* | (2006.01) |
| *H02P 7/06* | (2006.01) |

(52) U.S. Cl.
CPC ............. *H03K 7/08* (2013.01); *G03G 15/043* (2013.01); *H02P 7/06* (2013.01)

(58) Field of Classification Search
CPC .......... G03G 15/043; H03K 7/08; H03K 9/08; H03K 19/21
See application file for complete search history.

(56) References Cited

U.S. PATENT DOCUMENTS

| | | |
|---|---|---|
| 5,965,872 A | 10/1999 | Endo et al. |
| 6,049,074 A | 4/2000 | Endo et al. |
| 6,731,317 B2 * | 5/2004 | Ema ............ H04N 1/4056 347/132 |
| 8,264,700 B2 | 9/2012 | Takeda |
| 2005/0158062 A1 | 7/2005 | Yamada et al. |
| 2010/0097114 A1 * | 4/2010 | Miyazaki .......... H03K 7/08 327/176 |

FOREIGN PATENT DOCUMENTS

| | | |
|---|---|---|
| EP | 1 241 869 A2 | 9/2002 |
| JP | 2009-137037 A | 6/2009 |

OTHER PUBLICATIONS

European Search Report dated Dec. 13, 2016 in European Application No. 16182184.8.

* cited by examiner

*Primary Examiner* — Erika J Villaluna
(74) *Attorney, Agent, or Firm* — Fitzpatrick, Cella, Harper & Scinto

(57) ABSTRACT

A PWM signal generating apparatus configured to generate a PWM signal by applying parallel serial conversion to pattern data obtained by converting input data into a waveform pattern of a PWM signal having one pulse divided into a predetermined number of pulses, the PWM signal generating apparatus including: a clock generating circuit configured to generate a plurality of clock signals having mutually different phases; a conversion circuit configured to convert the input data into the waveform pattern of the PWM signal; an encoding circuit configured to generate, from the waveform pattern, a plurality of encoded signals synchronized with respective clocks of the plurality of clock signals generated by the clock generating circuit; and a decoding circuit configured to generate the PWM signal from the plurality of encoded signals output from the encoding circuit.

6 Claims, 9 Drawing Sheets

PWM SIGNAL GENERATING APPARATUS, MOTOR CONTROL APPARATUS, AND LIGHT SCANNING APPARATUS

BACKGROUND OF THE INVENTION

Field of the Invention

The present invention relates to a pulse width modulation (PWM) signal generating apparatus, a motor control apparatus, and a light scanning apparatus. For example, the present invention relates to a PWM signal generating apparatus, a motor control apparatus, and a light scanning apparatus which are mounted to an image forming apparatus such as a laser printer and a digital copying machine for forming an image by subjecting a photosensitive member to charging, exposure, and development with the use of electrophotography.

Description of the Related Art

An electrophotographic image forming apparatus includes a light scanning apparatus configured to emit a light beam, and irradiates a surface of a uniformly charged photosensitive member with the light beam corresponding to image data, to thereby form a latent image on the photosensitive member. The light scanning apparatus includes a sensor located in a predetermined position on a scanning line of the light beam, and detects a timing to emit the light beam corresponding to the image data based on a result of detecting the light beam with the use of the sensor. An image forming apparatus generates a PWM signal for driving a light source based on the image data with reference to the timing based on a detection result from the sensor, and controls the light scanning apparatus, to thereby form the latent image on the photosensitive drum. When an image is to be formed, an image resolution is determined by a drive resolution of a laser. In order to increase the image resolution, there is proposed a configuration using a parallel serial conversion circuit (see, for example, Japanese Patent Application Laid-Open No. 2009-137037). Further, control using the PWM signal is also used for control of a rotation speed of a motor or the like.

With a related-art method of generating a PWM signal, pattern data on a PWM signal is generated by the parallel serial conversion circuit. The parallel serial conversion circuit uses a shift operation of a flip-flop circuit (hereinafter referred to as "F/F") inside a semiconductor, and hence it is easy to make an operating frequency relatively higher. The operating speed of the F/F needs to be increased in order to generate the PWM signal having a higher resolution, but the operating speed of the F/F is nearing an upper limit as well, and it is becoming more difficult to further increase the resolution.

SUMMARY OF THE INVENTION

It is an object of the present invention to control a pulse width of a PWM signal with a high resolution.

According to one embodiment of the present invention, there is provided a PWM signal generating apparatus configured to generate a PWM signal by applying parallel serial conversion to pattern data obtained by converting input data into a waveform pattern of a PWM signal having one pulse divided into a predetermined number of pulses, the PWM signal generating apparatus comprising: a clock generating circuit configured to generate a plurality of clock signals having mutually different phases; a conversion circuit configured to convert the input data into the waveform pattern of the PWM signal; an encoding circuit configured to generate, from the waveform pattern, a plurality of encoded signals synchronized with respective clocks of the plurality of clock signals generated by the clock generating circuit; and a decoding circuit configured to generate the PWM signal from the plurality of encoded signals output from the encoding circuit.

According to one embodiment of the present invention, there is provided a motor control apparatus, comprising: a motor; a sensor configured to detect a period of the motor; the PWM signal generating apparatus described above; and a control portion configured to control the motor by controlling a pulse width of a PWM signal output from the PWM signal generating apparatus based on a detection result of the sensor.

According to one embodiment of the present invention, there is provided a light scanning apparatus configured to irradiate a photosensitive member with a laser beam to form a latent image, the light scanning apparatus comprising: a laser diode configured to emit the laser beam; the PWM signal generating apparatus described above configured to output a PWM signal based on image data; and a control unit configured to control a light intensity of the laser beam based on the PWM signal output from the PWM signal generating apparatus.

Further features of the present invention will become apparent from the following description of exemplary embodiments with reference to the attached drawings.

DESCRIPTION OF THE EMBODIMENTS

Now, modes for carrying out the present invention will be described in detail as embodiments with reference to the accompanying drawings.

First Embodiment

[PWM Signal Generating Apparatus]
(Multiphase Clock Generating Portion)

Figure 1:
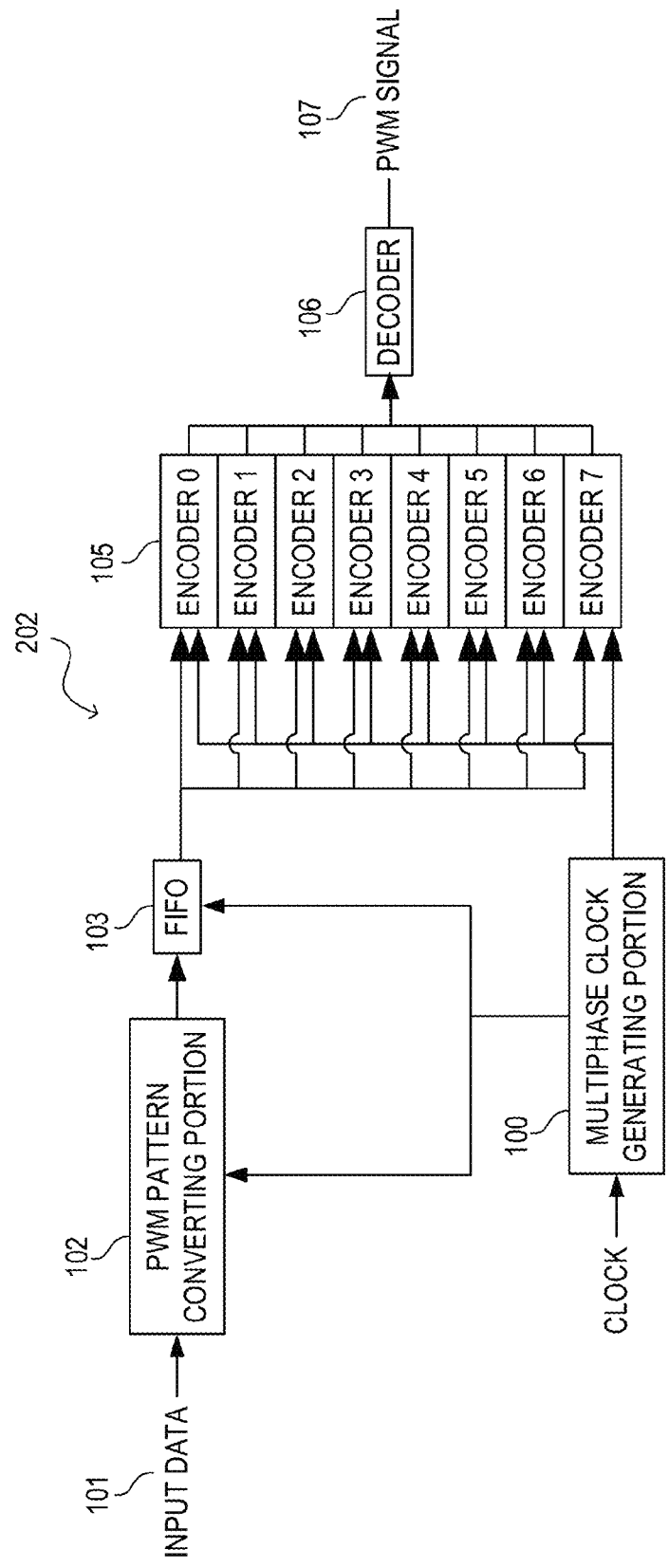
FIG. 1 is a block diagram of a PWM signal generating apparatus according to a first embodiment and a second embodiment of the present invention.
Figure 2A:
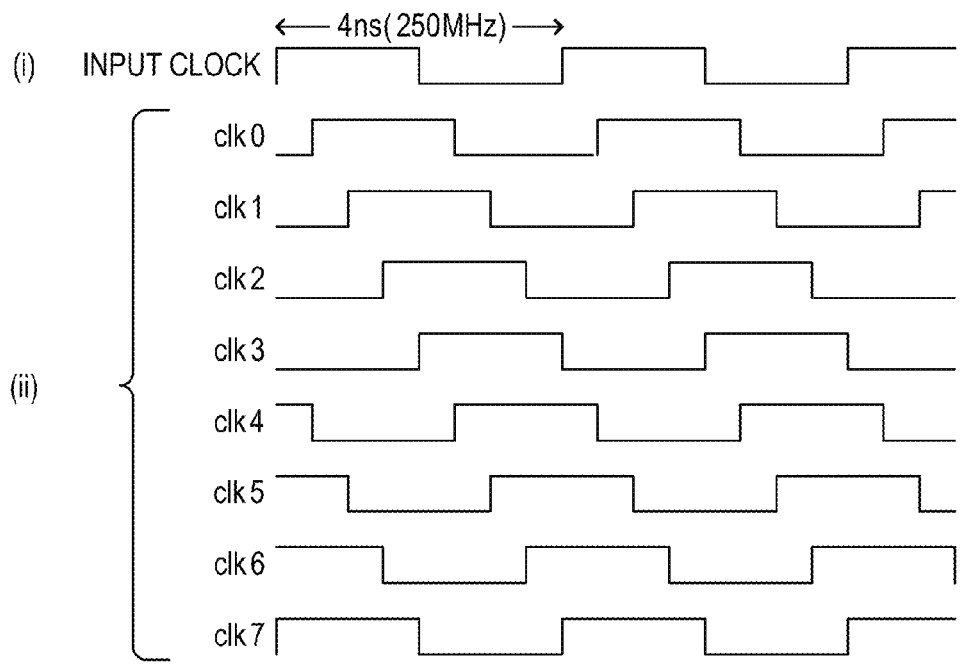
FIG. 2A is a diagram for illustrating waveforms of clocks generated by a multiphase clock generating portion according to the first and second embodiments.

FIG. 1 is a diagram for illustrating a configuration of a PWM generating portion 202 being a PWM signal generating apparatus according to a first embodiment of the present invention. A multiphase clock generating portion 100 being a clock generating circuit configured to generate a clock signal generates eight clocks having mutually different phases. The multiphase clock generating portion 100 sets an input clock being input as a reference clock to lock a frequency and a phase. The frequency of the clock being input to the multiphase clock generating portion 100 is 250 MHz. FIG. 2A is an illustration of a waveform of the input clock being input to the multiphase clock generating portion 100 and waveforms of eight clocks generated by the multiphase clock generating portion 100. In FIG. 2A, (i) indicates the input clock being input to the multiphase clock generating portion 100, and (ii) indicates eight clocks clk0 to clk7 generated by the multiphase clock generating portion 100. In FIG. 2A, the clock of (i) and clk7 of (ii) are clocks having the same phase and the same frequency. In FIG. 2A, as described above, the clock of (i) is a clock having a frequency of 250 MHz (with a period of 4 nanoseconds (ns)). In FIG. 2A, clk0 of (ii) is a clock having a phase delayed from clk7 by ⅛ phase (500 picoseconds (ps)) of the period. In the same manner, the multiphase clock generating portion 100 generates clocks clk1, clk2, clk3, clk4, clk5, and clk6 each being delayed from the previous clock in the stated order by ⅛ phase. The multiphase clock generating portion 100 generates a plurality of (eight) clocks having the same frequency as that of the input clock but having phases different from that of the input clock.

(PWM Pattern Converting Portion)

Figure 2B:
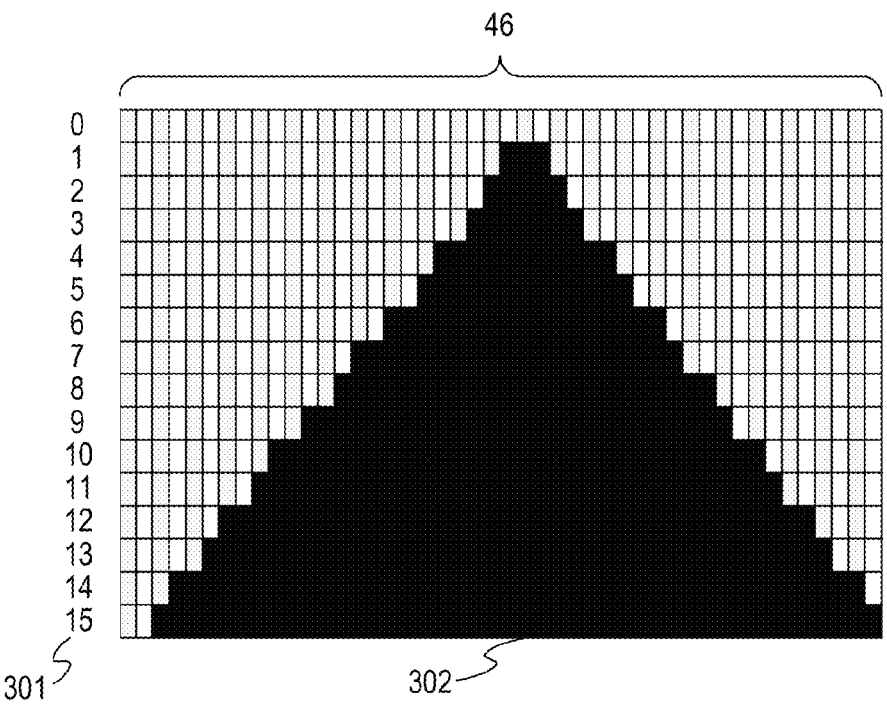
FIG. 2B is a diagram for illustrating conversion of a data value of a pulse width into pattern data on a PWM signal.

The description returns to FIG. 1. Input data 101 being pulse data is input to a PWM pattern converting portion 102. The pulse data includes data on an on-width of a pulse (hereinafter referred to simply as "pulse width") and data on a period of the pulse, and is a synchronizing signal of clk7 of (ii) in FIG. 2A. The PWM pattern converting portion 102 converts the input pulse data into pattern data being a waveform pattern of a PWM signal. FIG. 2B is a diagram for illustrating an example of a conversion table between a data value of the pulse width and the pattern data (bit pattern) of the PWM signal. The conversion table indicates a correspondence relationship between a data value 301 based on the input data 101 and pattern data 302. The data value 301 is 4-bit data. The pattern data 302 is a bit pattern including 46-bit data. The conversion table illustrated in FIG. 2B is a table for converting 4-bit multivalued data into 46-bit binary pattern data. A different pattern data is assigned to each 4-bit data of the data value 301 of the conversion table. The pattern data indicates, for example, "0" by the white cell and "1" by the black cell in FIG. 2B. For example, when the data value 301 of the pulse width of the input data 101 that has been input is "15", the PWM pattern converting portion 102 converts the data value 301 into the pattern data 302 illustrated in the row of "15" in FIG. 2B. The PWM pattern converting portion 102 outputs the pattern data 302 corresponding to the data value 301 of the pulse width of the input data 101 to first-in first-out (FIFO) 103.

(FIFO)

Figure 3:
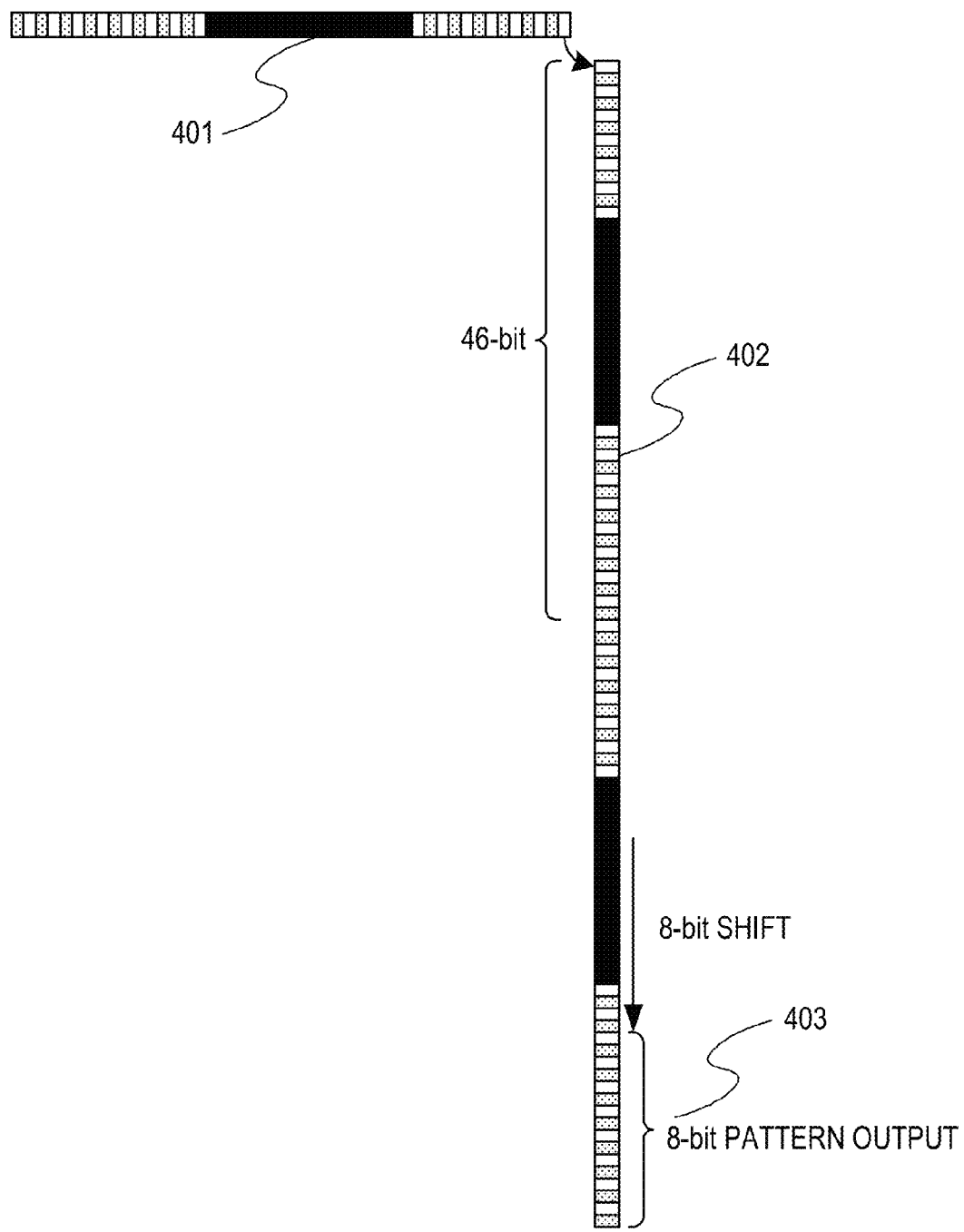
FIG. 3 is a diagram for illustrating processing conducted at FIFO according to the first and second embodiments.

FIG. 3 is a diagram for illustrating an operation of the FIFO 103. Pattern data 401 is input to the FIFO 103 from the PWM pattern converting portion 102. A FIFO buffer 402 of the FIFO 103 has a capacity of 96 bits, and can adjust an input bit width so as to fit a data length of the pattern data 302. In this embodiment, as described with reference to FIG. 2B, the pulse period is set to 46, and the input bit width of the FIFO buffer 402 is set to 46 bits so as to fit the pattern data 302.

The FIFO 103 conducts a shift operation in units of 8 bits with the use of the FIFO buffer 402. An operation clock exhibited when the FIFO 103 conducts the shift operation is synchronized with clk7 illustrated in (ii) of FIG. 2A. Further, the FIFO 103 outputs pattern data 403 of the last 8 bits to the encoder 105. At the FIFO 103, the shift operation in units of 8 bits and the output of the 8-bit pattern data 403 are repeated, and when a blank area of the FIFO buffer 402 becomes at least 46 bits, the subsequent pattern data 401 is input from the PWM pattern converting portion 102.

(Encoder)

Figure 4A:
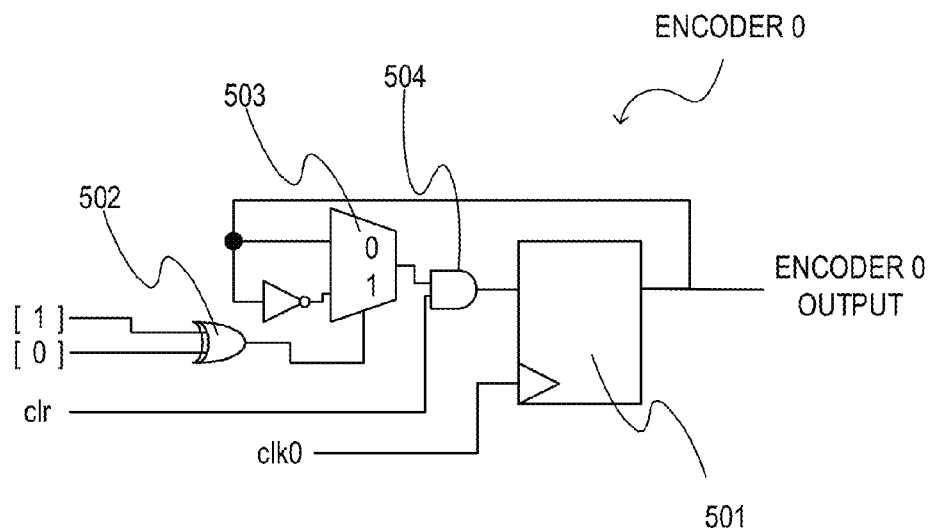
FIG. 4A is a diagram for illustrating a configuration of an encoder according to the first and second embodiments.

The encoder 105 being an encoder circuit includes Encoders 0 to 7 each using, as the operation clock, each of the eight clocks (clk0 to clk7) generated by the multiphase clock generating portion 100. FIG. 4A is a detailed illustration of Encoder 0. Encoder 0 includes a flip-flop circuit (hereinafter referred to as "F/F") 501, an exclusive OR circuit (hereinafter referred to as "XOR circuit") 502, a selector 503, and a logical product circuit (hereinafter referred to as "AND circuit") 504. The clock clk0 is input to the F/F 501 from the multiphase clock generating portion 100, while 2-bit data being a part of the 8-bit pattern data 403 is input to the F/F 501 from the FIFO 103. Specifically, data of Bit 0 ([0]) and Bit 1 ([1]) is input to Encoder 0 from the 8-bit pattern data 403 of the FIFO buffer 402 input from the FIFO 103. The data of Bit 0 and Bit 1 input from the FIFO 103 is input to the XOR circuit 502, and the XOR circuit 502 detects an edge of the pattern data 403.

Figure 4B:
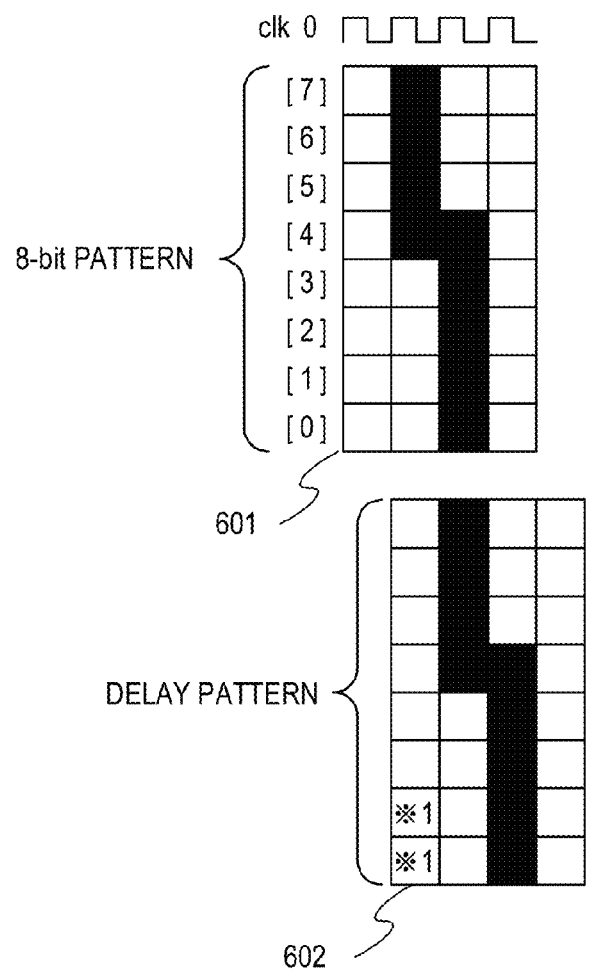
FIG. 4B is a diagram for illustrating processing conducted at Encoder 0.

FIG. 4B is an illustration of an example of the pattern data of 8 bits (hereinafter referred to as "8-bit pattern") input from the FIFO 103 to the encoder 105. The 8-bit pattern data 403 output from the FIFO buffer 402 is input to Encoder 0 of the encoder 105 in synchronization with clk0. In FIG. 4B, an 8-bit pattern 601 indicates an example of an 8-bit pattern corresponding to four clocks. Further, in FIG. 4B, a delay pattern 602 is a signal obtained by delaying the 8-bit pattern 601 by one clock. Bit 0 and Bit 1 (parts indicated by "✕1" in FIG. 4B) of the data on the delay pattern 602 are input to Encoder 0. The XOR circuit 502 detects a rising edge or a falling edge of Bit 0 and Bit 1. When different data is input to the XOR circuit 502, the XOR circuit 502 outputs "1". In this case, the XOR circuit 502 detects the rising edge or the falling edge of the delay pattern 602.

The XOR circuit 502 outputs a result of detecting the rising edge or the falling edge of Bit 0 and Bit 1 of the delay pattern 602 to the selector 503 as an encoded signal. When the detection result from the XOR circuit 502 is "1", the selector 503 causes an output value of the F/F 501 to be inverted, and when the detection result from the XOR circuit 502 is "0", causes the output value of the F/F 501 to be maintained. Further, the selector 503 is connected to the F/F 501 through the AND circuit 504. An output of the selector 503 and a clr signal described later are input to the AND circuit 504. The output of the AND circuit 504 is connected to the F/F 501, and is configured to have an initial value of the F/F 501 set to "0" by the clr signal. The clr signal is a signal for setting in advance the output value of the F/F 501 to "0". Basically, it may suffice that the initial value is set to "0" only once when an apparatus is activated. In the case of the delay pattern 602 illustrated in FIG. 4B, Encoder 0 only outputs "0" during four clocks.

Encoder 1 obtains an exclusive OR of Bit 2 ([2]) and Bit 1 ([1]) of the delay pattern 602 through the XOR circuit 502 with clk1 being used as the operation clock, to thereby determine the output value of Encoder 1. In the same manner, Encoder 2 determines the output value of Encoder 2 based on Bit 3 ([3]) and Bit 2 ([2]) of the delay pattern 602 in synchronization with clk2. Encoder 3 determines the output value of Encoder 3 based on Bit 4 ([3]) and Bit 3 ([2]) of the delay pattern 602 in synchronization with clk3. Encoder 4 determines the output value of Encoder 4 based on Bit 5 ([3]) and Bit 4 ([2]) of the delay pattern 602 in synchronization with clk4. Encoder 5 determines the output value of Encoder 5 based on Bit 6 ([3]) and Bit 5 ([2]) of the delay pattern 602 in synchronization with clk5. Encoder 6 determines the output value of Encoder 6 based on Bit 7 ([7]) and Bit 6 ([2]) of the delay pattern 602 in synchronization with clk6. Encoder 7 determines the output value of Encoder 7 based on Bit 0 ([3]) of the 8-bit pattern 601 and Bit 7 ([7]) of the delay pattern 602 in synchronization with clk7.

Figure 5A:
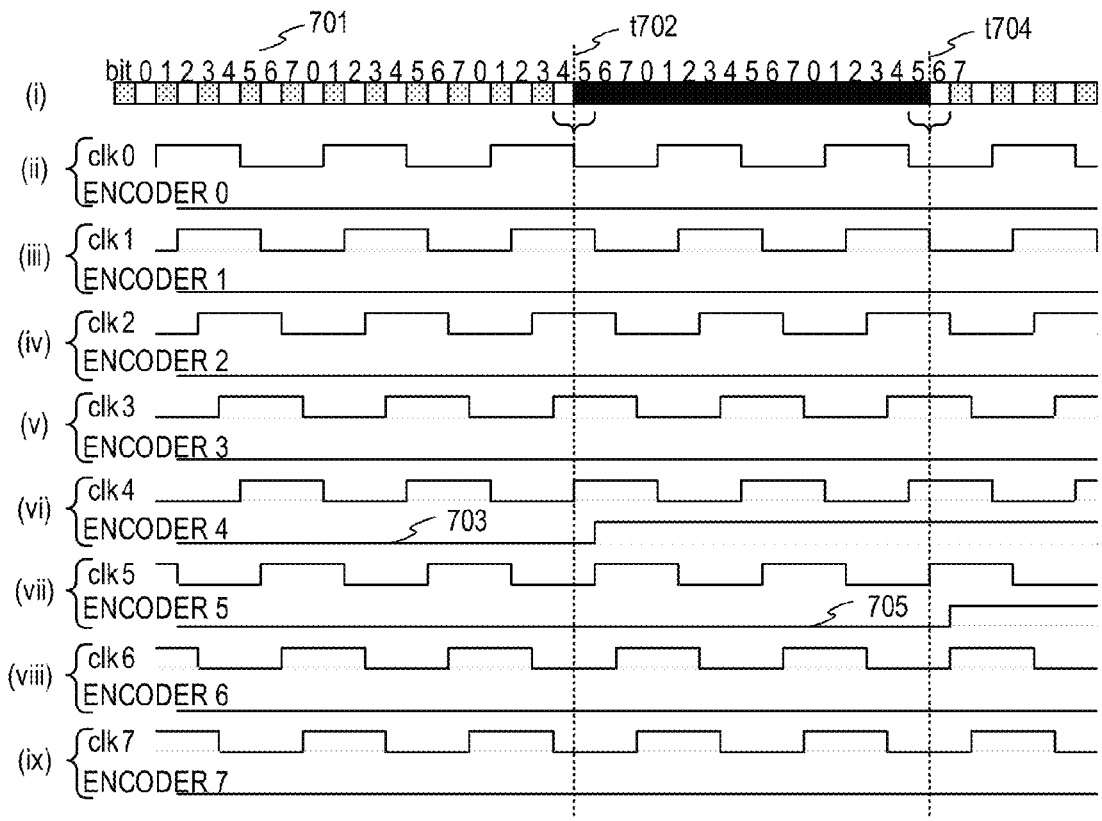
FIG. 5A is a diagram for illustrating a signal output from the encoder according to the first and second embodiments.

FIG. 5A is an illustration of a relationship between pattern data 701 and outputs of the encoder 105. The pattern data 701 containing repetitions of Bits 0 to 7 indicates a bit position obtained when the PWM signal is output and visualized with the 8-bit patterns 601 being concatenated. At a timing t702, the pattern data 701 rises. At this time, Encoder 4 sets an output 703 of Encoder 4 to "1" based on the exclusive OR of Bit 5 ([5]) and Bit 4 ([4]). Further, at a timing t704, the pattern data 701 falls. At this time, Encoder 5 sets an output 705 of Encoder 5 to "1" based on the exclusive OR of Bit 6 ([6]) and Bit 5 ([5]).

(Decoder)

Figure 5B:
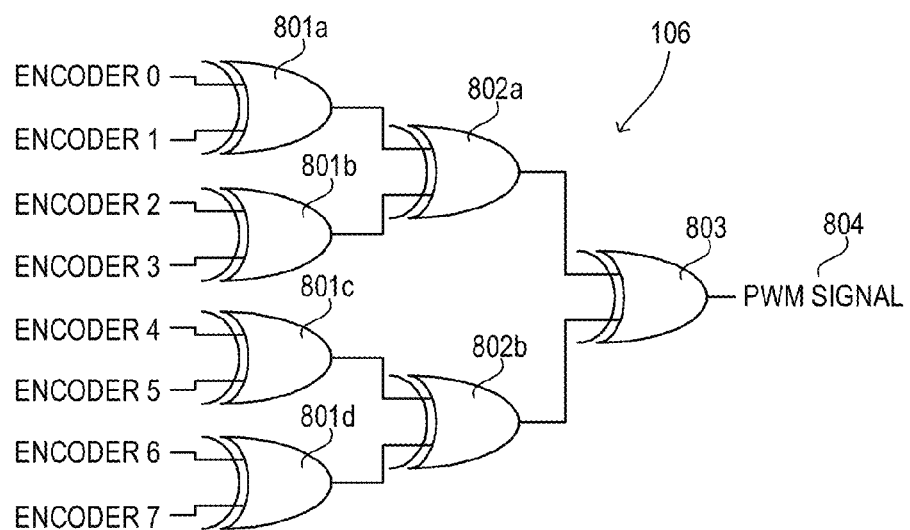
FIG. 5B is a diagram for illustrating a configuration of a decoder.
Figure 6A:
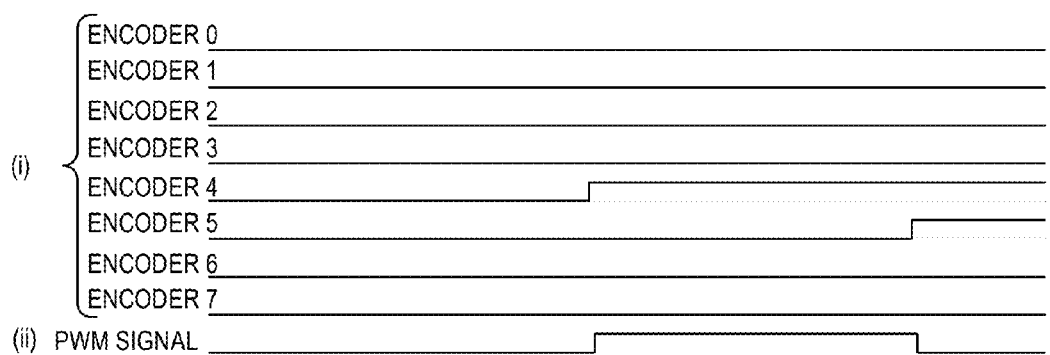
FIG. 6A is a diagram for illustrating signals input to and output from a decoder according to the first and second embodiments.

The output of the encoder 105 is input to a decoder 106 being a decoding circuit. The decoder 106 obtains the exclusive OR of the output values of Encoders 0 to 7, to thereby output the PWM signal 107. FIG. 5B is an illustration of a circuit example of the decoder 106. The decoder 106 includes XOR circuits 801a to 801d, 802a, 802b, and 803. The outputs of Encoder 0 and Encoder 1 are input to the XOR circuit 801a. The outputs of Encoder 2 and Encoder 3 are input to the XOR circuit 801b. The outputs of Encoder 4 and Encoder 5 are input to the XOR circuit 801c. The outputs of Encoder 6 and Encoder 7 are input to the XOR circuit 801d. Further, the outputs of the XOR circuit 801a and the XOR circuit 801b are input to the XOR circuit 802a. The outputs of the XOR circuit 801c and the XOR circuit 801d are input to the XOR circuit 802b. The outputs of the XOR circuit 802a and the XOR circuit 802b are input to the XOR circuit 803. The XOR circuit 803 generates and outputs a PWM signal 804. When there is a change in the value of any one of Encoders 0 to 7, the PWM signal 804 also changes. The outputs of Encoders 0 to 7 for the pattern data 701 illustrated in FIG. 5A are illustrated in (i) of FIG. 6A, and (ii) is an illustration of the PWM signal being the output of the decoder 106. In the case of the pattern data 701 illustrated in FIG. 5A, the PWM signal illustrated in (ii) of FIG. 6A is generated. At this time, synchronization is achieved for a circuit delay caused after the signals are input from Encoders 0 to 7 until the PWM signal 804 is output from the XOR circuit 803.

[Example of Application to Control of Motor]

Figure 6B:
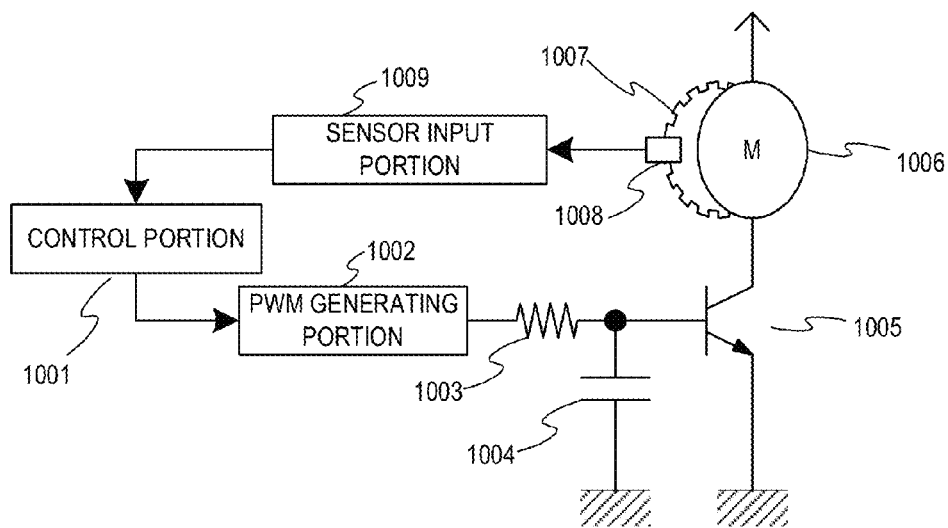
FIG. 6B is a diagram obtained when the PWM signal generating apparatus is applied to control of a motor.

FIG. 6B is an illustration of a configuration of motor control to which the PWM signal generating apparatus according to this embodiment is applied. A control portion 1001 sets an initial value having a predetermined pulse width in a PWM generating portion 1002 being the PWM signal generating apparatus according to this embodiment. The PWM generating portion 1002 outputs a PWM signal through the above-mentioned operation. The PWM signal generated by the PWM generating portion 1002 is smoothed by a resistor 1003 and a capacitor 1004, and is converted into a voltage corresponding to the pulse width of the PWM signal. At this time, the resistor 1003 and the capacitor 1004 function as low-pass filters, and block a frequency of the PWM signal to function as a simple analog converter.

A voltage corresponding to the pulse width of the PWM signal is supplied to a base terminal of a transistor 1005. A collector terminal of the transistor 1005 is connected to a DC motor 1006, and an emitter terminal of the transistor 1005 is grounded. The transistor 1005 controls a current flowing between the collector terminal and the emitter terminal based on the base voltage of the transistor 1005, to thereby control the DC motor 1006. An encoder 1007 is attached onto the shaft of the DC motor 1006. An encoder sensor 1008 detects an encoder pulse emitted from the encoder 1007, and outputs the encoder pulse to a sensor input portion 1009. The sensor input portion 1009 detects a period of the encoder pulse input from the encoder sensor 1008, and outputs the period of the encoder pulse to the control portion 1001. The control portion 1001 calculates a rotation speed of the DC motor 1006 based on the input period of the encoder pulse.

When determining that the calculated rotation speed of the DC motor 1006 is below a predetermined speed, the control portion 1001 increases the value of the pulse width of the PWM signal to be set for the PWM generating portion 1002. When determining that the calculated rotation speed of the DC motor 1006 is larger than the predetermined speed, the control portion 1001 decreases the value of the pulse width of the PWM signal to be set for the PWM generating portion 1002. The control portion 1001 thus controls the DC motor 1006.

Although not shown in FIG. 6B, the DC motor 1006 is connected not only to the encoder 1007 but also to objects to be driven, e.g., gears, rollers, tires, and arms. The rotation speed of the DC motor 1006 in operation fluctuates due to load fluctuations or the like. In this embodiment, feedback control for controlling the pulse width of the PWM signal based on the period of the encoder pulse is conducted in order to reduce the fluctuations in the rotation speed of the DC motor 1006. At this time, the control of the base voltage of the transistor 1005 needs to be conducted with higher accuracy at higher speed when a quick operation is required as a control condition or when speed control needs to be conducted with higher accuracy. In addition, the period of the PWM signal generated by the PWM generating portion 1002 is shortened in order to control the base voltage of the transistor 1005 at higher speed, and an output resolution of the PWM signal is increased in order to control the base voltage with higher accuracy. In any one of the cases, it is required to provide a circuit configured to turn on and off the PWM signal generated by the PWM generating portion 1002 at higher speed. Even in such a case, the PWM signal generating apparatus according to this embodiment described above can be used.

As described above, according to this embodiment, it is possible to control the pulse width of the PWM signal with a high resolution.

Second Embodiment

[Image Forming Apparatus]
(Original Conveying Portion)

Figure 7:
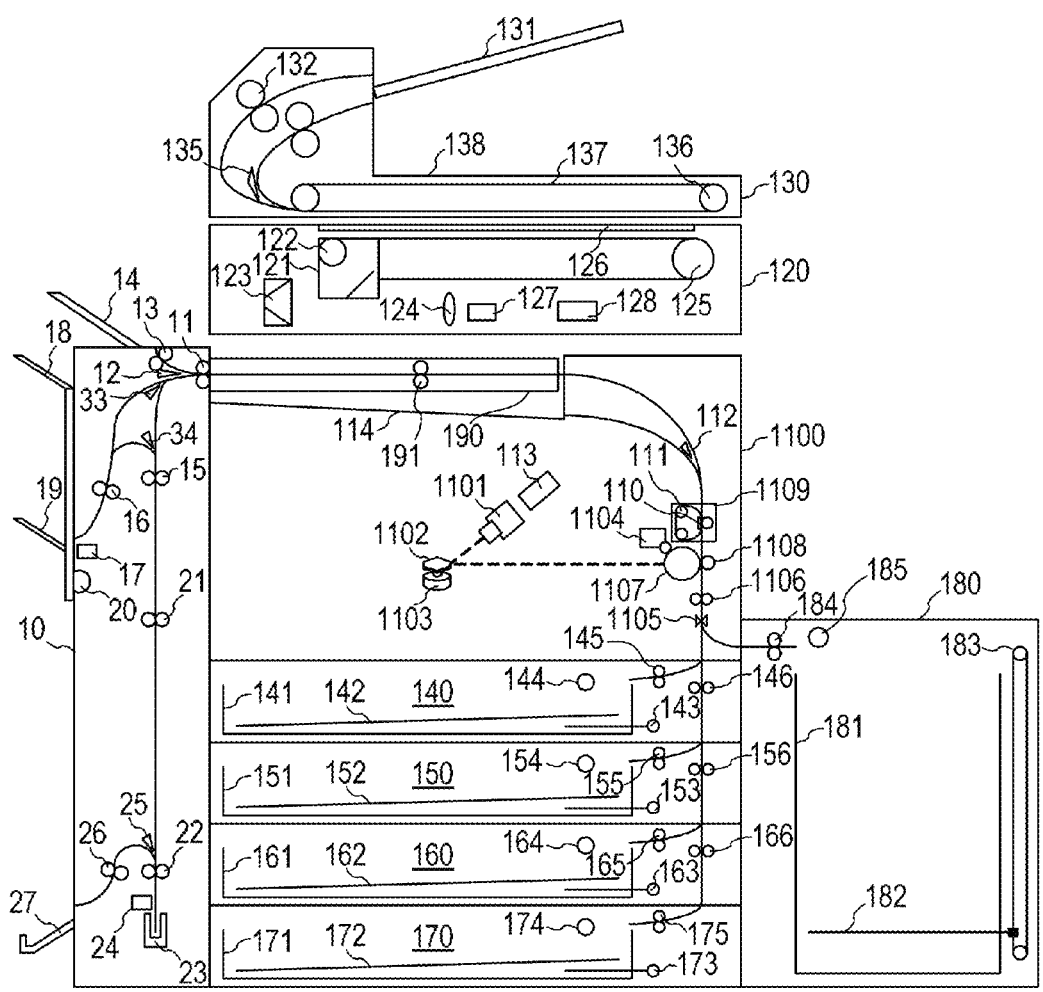
FIG. 7 is a diagram for illustrating a configuration of an image forming apparatus according to the second embodiment.

FIG. 7 is an illustration of a configuration of a main body of a digital multifunction peripheral according to a second embodiment of the present invention (hereinafter also referred to simply as "main body"). The original conveying portion 130 is configured as follows. That is, originals set on an original placing plate 131 are conveyed sheet by sheet to an original reading position by sheet feeding rollers 132. The original reading position represents a predetermined position in which an operation for reading an original is conducted by an original reading portion 120. The original is conveyed to the original reading position by an original conveying belt 137 driven by a motor 136. After the operation for reading the original, a conveyance route is changed by a flapper 135, and the motor 136 is rotated in a reverse direction, to thereby deliver the original onto a delivery tray 138.

(Image Reading Portion)

The original reading portion 120 is configured as follows. That is, an exposure lamp 122 includes a fluorescent lamp and a halogen lamp, and irradiates the original on an original placement glass (original table) 126 while moving in a direction perpendicular to a longitudinal direction of the exposure lamp 122. Scattered light reflected by the original through the irradiation of the exposure lamp 122 is reflected by a first mirror base 121 and a second mirror base 123, and reaches a lens 124. At this time, the second mirror base 123 moves at speed of ½ of the speed of the first mirror base 121 relative to movement of the first mirror base 121, and a distance between the irradiated original surface and the lens 124 is constantly maintained at a fixed distance. The first mirror base 121 and the second mirror base 123 are driven by a motor 125 to move. An image of the original is imaged on a light-receiving portion of a CCD line sensor 127 having thousands of light-receiving elements arranged in linear shapes through the first mirror base 121, the second mirror base 123, and the lens 124, and is subjected to photoelectric conversion in units of lines consecutively by the CCD line sensor 127. A signal photoelectrically converted by the CCD line sensor 127 is processed by a signal processing portion 128 to be output.

(Image Forming Portion)

An image forming portion 1100 is configured as follows. That is, an exposure control portion conducts processing corresponding to characteristics of electrophotography by an image processing portion 113 based on an image signal output from the signal processing portion 128. The exposure control portion drives a laser diode 1101 configured to emit a laser beam, and applies a light beam to the surface of the photosensitive drum 1107 being a photosensitive member been rotated at a fixed speed. At this time, a rotary polygon mirror 1102 being rotated by a motor 1103 is used to scan the light beam in parallel with a rotary shaft direction of the photosensitive drum 1107 having a drum shaped. The photosensitive drum 1107 is configured so that, before the irradiation of the light beam, charges remaining on the photosensitive drum 1107 are eliminated by a pre-exposure lamp (not shown), and the surface of the photosensitive drum 1107 is uniformly charged by a charger (not shown). Therefore, the photosensitive drum 1107 is irradiated with the light beam while being rotated, to thereby form a latent image on the surface of the photosensitive drum 1107. Then, the developing device 1104 visualizes the latent image formed on the surface of the photosensitive drum 1107 by developing the latent image with a developer (toner) of a predetermined color.

The transfer sheets conveyed from sheet feeding stages 140, 150, 160, and 170, and a sheet feeding deck 180 configured to receive transfer sheets as described later are conveyed to registration rollers 1106. The registration rollers 1106 detect arrival of a transfer sheet with the use of a sensor 1105, and feed the transfer sheet at a timing suitable for both a leading edge of the image formed on the photosensitive drum 1107 and a leading edge of the transfer sheet. A transferring charger 1108 transfers a toner image developed on the photosensitive drum 1107 onto the fed transfer sheet. On the photosensitive drum 1107, the toner remaining on the surface after the transfer is eliminated by a cleaner (not shown). The transfer sheet onto which the toner image has been transferred is likely to be separated from the photosensitive drum 1107 because the photosensitive drum 1107 has a large curvature. In addition, a voltage is applied to a charge eliminating needle (not shown), to thereby weaken an adsorbability between the photosensitive drum 1107 and the transfer sheet, which facilitates the separation.

The separated transfer sheet is sent to a fixing portion 1109, and the toner is fixed to the transfer sheet. The fixing portion 1109 includes a ceramic heater 110, a film 111, and two rollers. Heat emitted from the ceramic heater 110 is effectively conducted to the toner on the transfer sheet through the thin film 111. A direction flapper 112 switches a delivery destination of the transfer sheet subjected to the fixation between a tray 114 and a conveyance unit 190 depending on an operation mode. The conveyance unit 190 is a unit configured to convey the transfer sheet to a post-processing apparatus 10 described later, and conveys the transfer sheet through conveyance rollers 191.

The sheet feeding stages 140, 150, 160, and 170 are sheet feeding stages provided to the main body, and are configured to have the same mechanism. The sheet feeding deck 180 is a deck sheet feeding stage more capable of receiving a larger volume of transfer sheets than the sheet feeding stages 140, 150, 160, and 170. The sheet feeding stages 140, 150, 160, and 170 have substantially the same configuration, and hence the configuration of the sheet feeding stage 140 is described below.

A bottom plate 142 to be vertically moved by a lift-up motor 143 is arranged on a bottom surface of a cassette 141 configured to receive transfer sheets. Rising of the bottom plate 142 allows the transfer sheet received in the cassette 141 to stand by at a predetermined stand-by height. The transfer sheet standing by in a predetermined position is conveyed to a sheet feeding roller pair 145 with the use of a pickup roller 144. The sheet feeding roller pair 145 has torques applied in a direction for feeding the transfer sheet and a reverse rotation direction, and thereby sends out the transfer sheets to a conveyance path sheet by sheet while preventing multifeed of the transfer sheets. Conveyance rollers 146 are a roller pair configured to convey further upward the transfer sheet conveyed from any one of the sheet feeding stages 150, 160, and 170 located below the sheet feeding stage 140. The sheet feeding stages 150, 160, and 170 include cassettes 151, 161, and 171, bottom plates 152, 162, and 172, lift-up motors 153, 163, and 173, pickup rollers 154, 164, and 174, and sheet feeding roller pairs 155, 165, and 175, respectively. The sheet feeding stages 150 and 160 include conveyance rollers 156 and conveyance rollers 166, respectively.

The sheet feeding deck 180 is configured as follows. That is, the sheet feeding deck 180 includes a sheet container 181 configured to receive transfer sheets, and a bottom plate 182 configured to raise the transfer sheet up to a stand-by position is also arranged on the bottom surface of the sheet container 181. The bottom plate 182 is connected to a belt rotated by a motor 183, and the rising and falling of the bottom plate 182 are controlled based on movement of the belt. The transfer sheet existing in the stand-by position is conveyed to a sheet feeding roller pair 184 by a pickup roller 185, and the sheet feeding roller pair 184 conveys the transfer sheet to the conveyance path while preventing the multifeed of the transfer sheets in the same manner as in the sheet feeding of the main body.

(Post-Processing Apparatus)

The post-processing apparatus 10 is configured as follows. That is, rollers 11 receive the transfer sheet conveyed from the image forming portion 1100 into an inside of the post-processing apparatus 10. When a tray 14 is selected as an output destination of the received transfer sheet, a conveyance direction is switched by a flapper 12, and the transfer sheet is delivered onto the tray 14 by rollers 13. The tray 14 is a tray to be temporarily used as, for example, a delivery destination of processing conducted as an interrupt during normal processing.

A tray 18 and a tray 19 are trays provided for normal use of the transfer sheet. The trays 18 and 19 are selected after the conveyance path is switched downward by the flapper 12 and when the conveyance path is further switched toward rollers 16 by a flapper 33. When the conveyance path is switched vertically downward by the flapper 33 and a flapper 34, the conveyance direction of the transfer sheet is changed to the reverse direction by rollers 15. In this case, the transfer sheet is flipped over to be delivered. When the transfer sheet is delivered onto the tray 18 or 19, staple processing using a stapler 17 can be conducted. The tray 18 and the tray 19 themselves are vertically moved with the use of a shift motor 20, to thereby switch between the tray 18 and the tray 19 as the output destination of the transfer sheet.

A tray 27 is a delivery tray to be used when a plurality of transfer sheets are subjected to bookbinding. The transfer sheets are conveyed from the rollers 15 to a primary accumulation portion 23 through rollers 21. In the primary accumulation portion 23, a predetermined number of transfer sheets are accumulated. After the predetermined number of transfer sheets have been accumulated in the primary accumulation portion 23, the plurality of transfer sheets are subjected to bookbinding processing by a stapler 24. When the bookbinding processing is finished, a direction of a flapper 25 is changed to rotate rollers 22 in a direction reverse to a direction for accumulating the transfer sheets, and the transfer sheets subjected to the bookbinding are delivered onto the tray 27 through rollers 26.

[Example of Application to Control of Laser Diode]

Figure 8A:
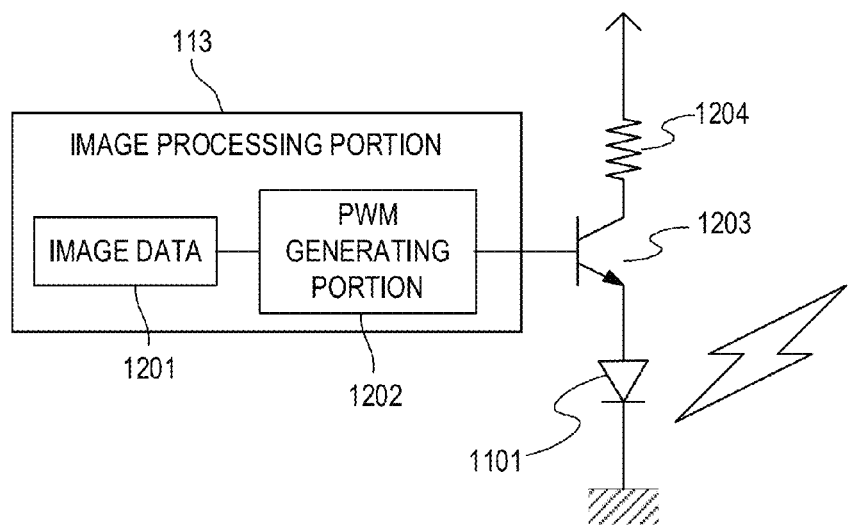
FIG. 8A is a diagram obtained when the PWM signal generating apparatus according to the second embodiment is applied to control of a laser diode.

FIG. 8A is an illustration of the image processing portion 113 and the laser diode 1101 according to this embodiment. Image data 1201 generated by the image processing portion 113 has a resolution of 1200 dpi (approximately 21 µm per pixel) and a density value of 16 levels of gray ranging from 0 to 15. The image data 1201 converts the input image data 1201 into a laser drive signal being the PWM signal by a PWM generating portion 1202 obtained by applying the PWM generating portion 202 described in the first embodiment to this embodiment. The PWM generating portion 1202 outputs the generated laser drive signal to a base terminal of a transistor 1203. The transistor 1203 has a collector terminal connected to a current limiting resistor 1204 and an emitter terminal connected to an anode terminal of the laser diode 1101. The laser diode 1101 has a cathode terminal grounded. The PWM generating portion 1202 controls the transistor 1203, to thereby allow a drive current of the laser diode 1101 to be controlled by the transistor 1203 and the current limiting resistor 1204. As a result, a light intensity of light emission is controlled.

(PWM Generating Portion)

Figure 8B:
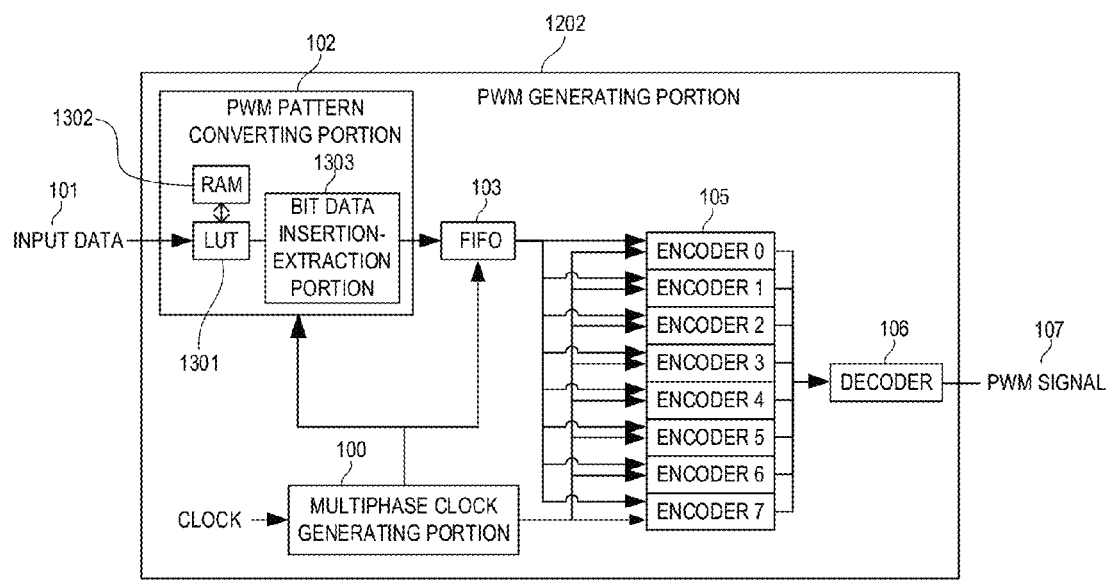
FIG. 8B is a diagram for illustrating the PWM signal generating apparatus.
Figure 9A:
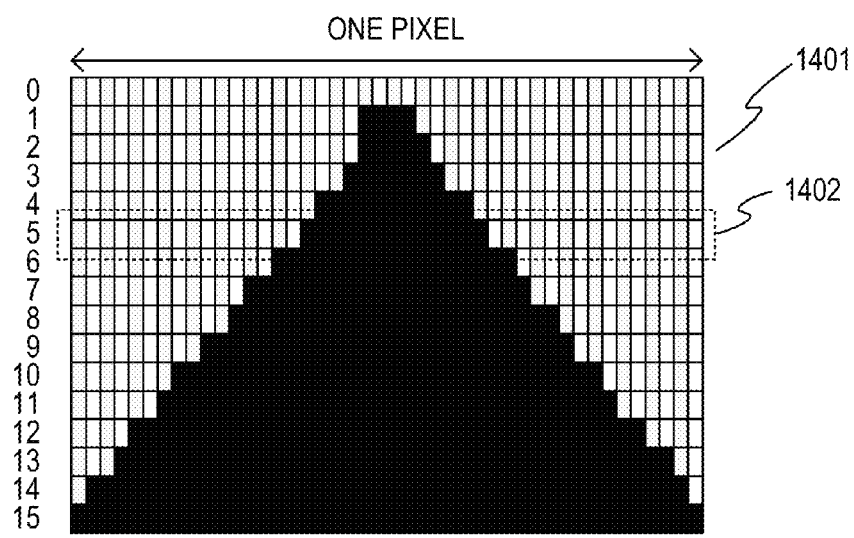
FIG. 9A is a diagram for illustrating conversion of a level of gray into the pattern data on the PWM signal according to the second embodiment.

FIG. 8B is an illustration of details of the PWM generating portion 1202 according to this embodiment. The same components as those of the configuration described in the first embodiment with reference to FIG. 1 are denoted by like reference numerals, and descriptions thereof are omitted. The input data 101 being the image data 1201 is converted by table data of a look-up table (LUT) 1301 corresponding to the image data read from a RAM 1302, and is output to a bit data insertion-extraction portion 1303. At this time, the input data 101 input to the LUT 1301 is data having 16 values ranging from 0 to 15 representing the levels of gray of pixels, and an address signal of the RAM 1302 is 4 bits. FIG. 9A is an illustration of internal data of the RAM 1302. Table data 1401 is an example obtained by dividing one pixel into 44. For example, pattern data 1402 on the PWM signal obtained when the image data 1201 is "5", which is framed by the broken line in FIG. 9A, has the following value of 44 bits in binary data. 00000000000000001111111111111000000000000000

The LUT 1301 outputs the 44-bit binary data to the bit data insertion-extraction portion 1303. In the pattern data 1402 on the PWM signal output from the LUT 1301, a bit data count of a pattern data string is changed by the bit data insertion-extraction portion 1303.

(Bit Data Insertion-Extraction Portion)

Figure 9B:
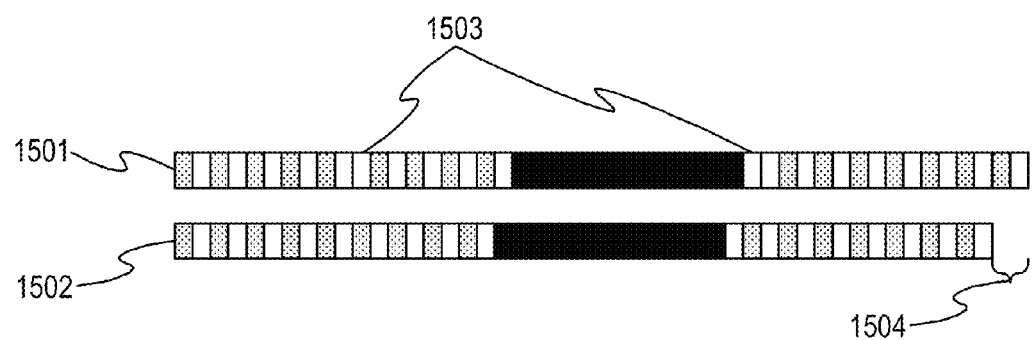
FIG. 9B is a diagram for illustrating bit pattern data.

Referring to FIG. 9B, an operation of the bit data insertion-extraction portion 1303 is described. The bit data insertion-extraction portion 1303 can insert and extract 1-bit data into/from pattern data 1502 input from the LUT 1301 in a predetermined position. When one pixel is divided into a predetermined number, the width of the divided pixel is obtained by dividing the width of one pixel by the predetermined number. In this embodiment, one pixel is divided into 44, and hence the width of the divided pixel is 1/44 of one pixel. The 1-bit data corresponds to one divided pixel. For example, in FIG. 9B, the bit data insertion-extraction portion 1303 inserts the divided pixel into the pattern data 1502 in a predetermined position. As a result, a divided pixel 1503 is inserted into pattern data 1501 in two positions. Therefore, the bit data count of the pattern data 1501 included in the pattern data becomes larger by two than the pattern data 1502 obtained before the divided pixel 1503 is inserted. The bit data count corresponding to one pixel becomes larger because the bit data count becomes larger by two, and hence one pixel becomes larger in terms of data. When one pixel is divided into a predetermined number, the bit data insertion-extraction portion 1303 can change the length of the pattern data 1502 by a unit fraction of which a denominator is the predetermined number.

The bit data insertion-extraction portion 1303 appropriately conducts an insertion-extraction operation for the divided pixel in a position along a main scanning direction, to thereby be able to correct a magnification of an image part along the main scanning direction. In order to correct a distortion of an image that occurs due to an optical distortion of a laser scanning system using the rotary polygon mirror 1102, it is required to correct the magnification with higher accuracy. Therefore, the correction can be conducted with higher accuracy as the length of one divided pixel of the divided pixel to be subjected to insertion-extraction by the bit data insertion-extraction portion 1303 becomes smaller. To that end, it is required to further increase a division number of one pixel.

The pattern data 1501, which has the divided pixel subjected to insertion-extraction by the bit data insertion-extraction portion 1303 to have the magnification changed, is output to the FIFO 103. The FIFO 103 uses the FIFO buffer 402 to conduct the shift operation in units of 8 bits and the output operation for the 8-bit pattern, which are described in the first embodiment, with a data width of (44 bits)±(several bits) corresponding to the input pattern data 1501. The FIFO 103 outputs 8-bit pattern data to the encoder 105. The processing to be conducted subsequently is the same as that of the first embodiment, and hence a description thereof is omitted.

As described above, according to this embodiment, it is possible to control the pulse width of the PWM signal with a high resolution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-157178, filed Aug. 7, 2015, which is hereby incorporated by reference herein in its entirety.

What is claimed is:

1. A PWM signal generating apparatus configured to generate a PWM signal, comprising:
   a clock generating circuit configured to generate a plurality of clock signals having a same frequency and mutually different phases;
   a conversion circuit configured to convert an input data which indicates a pulse width of the PWM signal into a bit pattern including a plurality of bit data;
   a buffer circuit configured to temporarily store the bit pattern converted by the conversion circuit, and to output the plurality of bit data on an uppermost bit side included in the bit pattern stored in the buffer circuit in synchronization with one clock signal of the plurality of clock signals;
   an encoding circuit configured to generate a plurality of encoded signals synchronized with respective clocks of the plurality of clock signals generated by the clock generating circuit based on the plurality of bit data output from the buffer circuit; and
   a decoding circuit configured to generate the PWM signal from the plurality of encoded signals output from the encoding circuit,
   wherein the encoding circuit comprises a plurality of encoders into which respective different clock signals of the plurality of clock signals and respective parts of the plurality of bit data are input,
   wherein the parts of the plurality of bit data output from the buffer circuit are out of phase with each other and input to the plurality of encoders, respectively,
   wherein the plurality of encoders are configured to generate the plurality of encoded signals based on the input bit data, and
   wherein the decoding circuit is configured to obtain an exclusive OR of the plurality of encoded signals generated by the plurality of encoders to generate the PWM signal.

2. A PWM signal generating apparatus according to claim 1, wherein the encoding circuit is configured to invert an output value when there is a change in a value of the bit pattern in a bit position of the bit pattern corresponding to a rising timing or a falling timing of each of the clocks.

3. A PWM signal generating apparatus according to claim 1, wherein the decoding circuit comprises an exclusive OR circuit.

4. A motor control apparatus, comprising:
   a motor;
   a sensor configured to detect a period of the motor;
   a PWM signal generating apparatus configured to generate a PWM signal, comprising:
   a clock generating circuit configured to generate a plurality of clock signals having a same frequency and mutually different phases;
   a conversion circuit configured to convert an input data which indicates a pulse width of the PWM signal into a bit pattern;
   a buffer circuit configured to temporarily store the bit pattern converted by the conversion circuit, and to output the plurality of bit data on an uppermost bit side included in the bit pattern stored in the buffer circuit in synchronization with one clock signal of the plurality of clock signals;
   an encoding circuit configured to generate a plurality of encoded signals synchronized with respective clocks of the plurality of clock signals generated by the clock generating circuit based on the plurality of bit data output from the buffer circuit; and
   a decoding circuit configured to generate the PWM signal from the plurality of encoded signals output from the encoding circuit,
   wherein the encoding circuit comprises a plurality of encoders into which respective different clock signals of the plurality of clock signals and respective parts of the plurality of bit data are input,
   wherein the parts of the plurality of bit data output from the buffer circuit are out of phase with each other and input to the plurality of encoders, respectively,
   wherein the plurality of encoders are configured to generate the plurality of encoded signals based on the input bit data, and
   wherein the decoding circuit is configured to obtain an exclusive OR of the plurality of encoded signals generated by the plurality of encoders to generate the PWM signal; and
   a control portion configured to control the motor by controlling a pulse width of the PWM signal output from the PWM signal generating apparatus based on a detection result of the sensor.

5. A light scanning apparatus configured to irradiate a photosensitive member with a laser beam to form a latent image, the light scanning apparatus comprising:
   a laser diode configured to emit the laser beam;
   a PWM signal generating apparatus configured to generate a PWM signal, comprising:
   a clock generating circuit configured to generate a plurality of clock signals having a same frequency and mutually different phases;
   a conversion circuit configured to convert an image data for forming a toner image on a photosensitive member into a bit pattern including a plurality of bit data;

a buffer circuit configured to temporarily store the bit pattern converted by the conversion circuit, and to output the plurality of bit data on an uppermost bit side included in the bit pattern stored in the buffer circuit in synchronization with one clock signal of the plurality of clock signals;

an encoding circuit configured to generate a plurality of encoded signals synchronized with respective clocks of the plurality of clock signals generated by the clock generating circuit based on the plurality of bit data output from the buffer circuit; and a decoding circuit configured to generate the PWM signal from the plurality of encoded signals output from the encoding circuit, wherein the encoding circuit comprises a plurality of encoders into which respective different clock signals of the plurality of clock signals and respective parts of the plurality of bit data are input, wherein the parts of the plurality of bit data output from the buffer circuit are out of phase with each other and input to the plurality of encoders, respectively, wherein the plurality of encoders are configured to generate the plurality of encoded signals based on the input bit data, and wherein the decoding circuit is configured to obtain an exclusive OR of the plurality of encoded signals generated by the plurality of encoders to generate the PWM signal; and a control unit configured to control a light intensity of the laser beam based on the PWM signal output from the PWM signal generating apparatus.

6. A light scanning apparatus according to claim 5, wherein the PWM signal generating apparatus is configured to change a length of the bit pattern by a unit fraction of which a denominator is a predetermined number.

* * * * *